(12) United States Patent
Ma et al.

(10) Patent No.: US 10,741,136 B2
(45) Date of Patent: Aug. 11, 2020

(54) DISPLAY PANEL AND DISPLAY DEVICE

(71) Applicant: WUHAN TIANMA MICRO-ELECTRONICS CO., LTD., Wuhan (CN)

(72) Inventors: Yangzhao Ma, Wuhan (CN); Tianqing Hu, Shanghai (CN); Zhaokeng Cao, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/253,736

(22) Filed: Jan. 22, 2019

(65) Prior Publication Data

US 2020/0135833 A1 Apr. 30, 2020

(30) Foreign Application Priority Data

Oct. 31, 2018 (CN) .......................... 2018 1 1284775

(51) Int. Cl.
*G09G 3/36* (2006.01)
*H01L 27/32* (2006.01)
*G09G 3/3258* (2016.01)

(52) U.S. Cl.
CPC ......... *G09G 3/3644* (2013.01); *G09G 3/3258* (2013.01); *G09G 3/3648* (2013.01); *G09G 3/3666* (2013.01); *H01L 27/3276* (2013.01); *G09G 2310/0281* (2013.01)

(58) Field of Classification Search
CPC .. G09G 3/3644; G09G 3/3666; G09G 3/3258; G09G 3/3648; G09G 2310/0281; H01L 27/3276

See application file for complete search history.

(56) References Cited

U.S. PATENT DOCUMENTS

| 2016/0111040 | A1* | 4/2016 | Kim ..................... G02F 1/13454 345/698 |
| 2017/0162605 | A1* | 6/2017 | Yamamoto ........ H01L 29/78645 |
| 2018/0190190 | A1* | 7/2018 | Xi ........................ G09G 3/3225 |

FOREIGN PATENT DOCUMENTS

| CN | 107331297 A | 11/2017 |
| CN | 107342036 A | 11/2017 |
| CN | 107633807 A | 1/2018 |

* cited by examiner

*Primary Examiner* — Liliana Cerullo
(74) *Attorney, Agent, or Firm* — Anova Law Group PLLC

(57) ABSTRACT

A display panel and a display device are provided. The display panel comprises a display area including data lines and an irregular-shaped edge extending in a column direction, and scanning lines and light-emitting controlling lines extending in a row direction; a non-display area including a first and a second non-display areas disposed at opposite sides of the display area along the row direction; and at least one notch formed by recessing the irregular-shaped edge towards an inside of the display area. The first non-display area includes first shift registers, the second non-display area includes second shift registers and light-emitting controllers, a first and second shift registers are connected to two ends of a scanning line, and a light-emitting controller is connected to a light-emitting controlling line. The first non-display area includes a first sub-non-display area disposed adjacent to the at least one notch and including electrostatic discharge circuits.

17 Claims, 12 Drawing Sheets

DISPLAY PANEL AND DISPLAY DEVICE

CROSS-REFERENCES TO RELATED APPLICATIONS

This application claims the priority of Chinese Patent Application No. CN201811284775.0, filed on Oct. 31, 2018, the entire contents of all of which are incorporated herein by reference.

FIELD OF THE DISCLOSURE

The present disclosure generally relates to the display technology and, more particularly, relates to a display panel and a display device thereof.

BACKGROUND

As electronic technology advances, manufacturing technology of display panels is continuing to mature. To drive a high screen-to-body ratio, in existing display panels are the frame is continuously compressed and an irregular-shaped screen has been designed, which is more convenient for providing space for important components such as a camera and an earpiece, thereby allowing a diverse user experience. Accordingly, full screen display panels have become the mainstream of current design.

Existing display devices, such as displays, televisions, mobile phones, tablets, etc., often have generally regular rectangular screens. With continuous development of display technology and diversified user demands on the appearance of display devices, simple rectangular display devices may not meet the consumer desires. Therefore, various shapes of display devices have emerged. In the existing technologies, the display device is often designed to have a shape other than a regular rectangle, and such a display device is generally named as an irregular-shaped display device.

The irregular-shaped display devices are able to diversify the screen of the display devices, thereby being applied to various products such as advertisement display screens, information indicating screens, vehicle screens, smart watches, smart bracelets, VR/AR glasses, etc., and having a wide range of applications. In addition, the irregular-shaped display devices are able to bypass some functional modules on the front panel of the display devices, such as a camera module, a sensor module or a speaker module, thereby improving the screen-to-body ratio of the display device and, accordingly, enhancing the display performance. Thus, the irregular-shaped display devices are more and more widely used.

However, as the design of the irregular-shaped display panels move towards increasing sophistication, a problem of how to reduce the risk of electrostatic damage in the irregular-shaped area raises. How to improve the capability of anti-electrostatic damage in the irregular-shaped area without degrading the screen-to-body ratio becomes a technical problem which is highly desired to be solved. The disclosed display panel and display device thereof are directed to solve one or more problems set forth above and other problems.

BRIEF SUMMARY OF THE DISCLOSURE

One aspect of the present disclosure provides a display panel. The display panel comprises a display area including a plurality of data lines, a plurality of scanning lines, a plurality of light-emitting controlling lines, and an irregular-shaped edge, wherein the scanning lines and the light-emitting controlling lines extend in a row direction, the data lines and the irregular-shaped edge extend in a column direction, and the row direction is perpendicular to the column direction; a non-display area including a first non-display area and a second non-display area, wherein along the row direction, the first non-display area and the second non-display area are disposed at opposite sides of the display area; and at least one notch. The irregular-shaped edge is recessed towards an inside of the display area to form the at least one notch. The first non-display area includes a plurality of cascaded first shift registers, and a first shift register is electrically connected to one end of a scanning line. The second non-display area includes a plurality of cascaded second shift registers and a plurality of cascaded light-emitting controllers, a second shift register is electrically connected to another end of the scanning line, and a light-emitting controller is electrically connected to a light-emitting controlling line. The first non-display area includes a first sub-non-display area disposed adjacent to the at least one notch in the row direction, and an electrostatic discharge module including a plurality of electrostatic discharge circuits is disposed in the first sub-non-display area.

Another aspect of the present disclosure provides a display device. The display device comprises the disclosed display panel. The display panel comprises a display area including a plurality of data lines, a plurality of scanning lines, a plurality of light-emitting controlling lines, and an irregular-shaped edge, wherein the scanning lines and the light-emitting controlling lines extend in a row direction, the data lines and the irregular-shaped edge extend in a column direction, and the row direction is perpendicular to the column direction; a non-display area including a first non-display area and a second non-display area, wherein along the row direction, the first non-display area and the second non-display area are disposed at opposite sides of the display area; and at least one notch. The irregular-shaped edge is recessed towards an inside of the display area to form the at least one notch. The first non-display area includes a plurality of cascaded first shift registers, and a first shift register is electrically connected to one end of a scanning line. The second non-display area includes a plurality of cascaded second shift registers and a plurality of cascaded light-emitting controllers, a second shift register is electrically connected to another end of the scanning line, and a light-emitting controller is electrically connected to a light-emitting controlling line. The first non-display area includes a first sub-non-display area disposed adjacent to the at least one notch in the row direction, and an electrostatic discharge module including a plurality of electrostatic discharge circuits is disposed in the first sub-non-display area.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which may be illustrated in the accompanying drawings. Hereinafter, embodiments consistent with the disclosure will be described with reference to drawings. Wherever possible, the same reference numbers will be used throughout the drawings to refer to the same or like parts. It may be apparent that the described embodiments may be some but not all of the embodiments of the present disclosure. Based on the disclosed embodiments, persons of ordinary skill in the art may derive other embodiments consistent with the present disclosure, all of which may be within the scope of the present disclosure. Further, in the present disclosure, the disclosed embodiments and the features of the disclosed embodiments may be combined under conditions without conflicts.

The present disclosure provides an improved display panel and a display device thereof with improved capability of anti-electrostatic damage in the irregular-shaped area.

Figure 1:
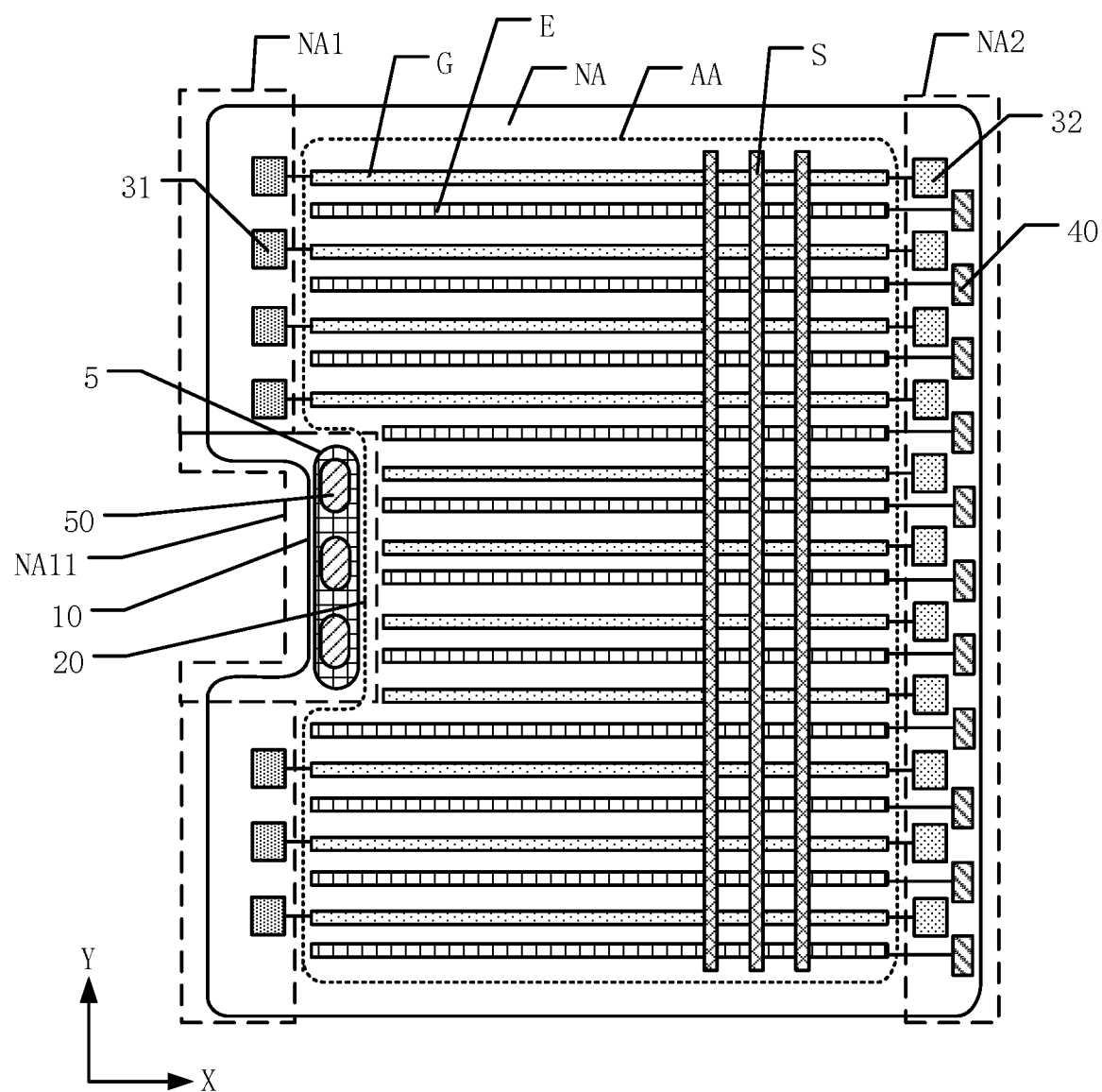
FIG. 1 illustrates a schematic top view of an exemplary display panel consistent with the disclosed embodiments.

FIG. 1 illustrates a schematic top view of an exemplary display panel consistent with the disclosed embodiments. As shown in FIG. 1, the display panel may include a display area AA, a non-display area NA, and at least one notch 10. The display area AA may include a plurality of data lines S, a plurality of scanning lines G, a plurality of light-emitting controlling lines E, and an irregular-shaped edge 20. The scanning lines G and the light-emitting controlling lines E may both extend in a row direction X, the data lines S and the irregular-shaped edge 20 may extend in a column direction Y. The irregular-shaped edge 20 may be recessed toward the inside of the display area AA to form the at least one notch 10. The row direction X may intersect the column direction Y.

To more intuitively illustrate the technical solution provided by the disclosed embodiments, FIG. 1 does not illustrate other structures of the display panel, such as thin film transistors, pixels, etc. Meanwhile, to better distinguish the scanning line G, the light-emitting controlling line E and the data line S, the scanning line G, the light-emitting controlling line E and the data line S are filled with different patterns in FIG. 1. The number of the scanning line G, the light-emitting controlling line E and the data line S shown in FIG. 1 is for illustrative purposes, and is not intended to limit the scope of the present disclosure.

Further, the non-display area NA may include a first non-display area NA1 and a second non-display area NA2, and along the row direction X, the first non-display area NA1 and the second non-display area NA2 may be disposed at opposite sides of the display area AA. The first non-display area NA1 may include a plurality of cascaded first shift registers 31, and each first shift register 31 may be electrically connected to one end of a scanning line G. The second non-display area NA2 may include a plurality of cascaded second shift registers 32, and each second shift register 32 may be electrically connected to another end of the scanning line G. In the first non-display area NA1, the plurality of cascaded first shift registers 31 may be sequentially arranged in the column direction Y. In the second non-display area NA2, the plurality of cascaded second shift register 32 may be sequentially arranged in the column direction Y.

The first non-display area NA1 may include a first sub-non-display area NA11, which may be disposed adjacent to the notch 10 in the row direction X. The second non-display area NA2 may include a plurality of cascaded light-emitting controllers 40, each of which may be electrically connected to a light-emitting controlling line E. In the second non-display area NA2, the plurality of cascaded light-emitting controllers 40 may be sequentially arranged in the column direction Y. The first sub-non-display area NA11 may be provided with an electrostatic discharge module 5, which may include a plurality of electrostatic discharge circuits 50.

In particular, the irregular-shaped edge 20 and the data lines S may both extend in the column direction Y, and the irregular-shaped edge 20 may be recessed toward the inside of the display area AA, thereby forming a space in which components such as a camera would be mounted, i.e., the notch 10. Thus, the shape design of the display panel may able to bypass some functional modules of the display device, such as a camera module, a sensor module or a speaker module, thereby improving the screen-to-body ratio of the display panel, enhancing the display performance and, accordingly, stratifying the user demands of the visual effect.

The first shift register 31 in the first non-display area NA1 may be electrically connected to one end of one scanning line G, and the second shift register 32 in the second non-display area NA2 may be electrically connected to another end of the same scanning line G. Thus, the first shift register 31 in the first non-display area NA1 and the second shift register 32 in the second non-display area NA2 may simultaneously provide a scanning signal to the scanning line G, which reduces the scanning charging time, improves the scanning efficiency, and enhances the user experience.

The second non-display area NA2 may include the plurality of cascaded light-emitting controllers 40, i.e., the plurality of cascaded light-emitting controllers 40 may be disposed in the second non-display area NA2 which is arranged opposite to the notch 10 in the row direction X. Meanwhile, the light-emitting controllers 40 may be electrically connected to the light-emitting controlling lines E. On one hand, the light-emitting controlling signal may be provided to the light-emitting controlling line E through the light-emitting controller 40, on the other hand, the plurality of cascaded light-emitting controllers 40 may not occupy any space of the non-display area NA arranged close to the notch 10. Thus, the wires arrangement at the notch 10 may be prevented from being affected by the light-emitting controllers 40, thereby facilitating the narrow frame design of the display panel and improving the screen-to-body ratio.

Further, the first sub-non-display area NA11 may be provided with the electrostatic discharge module 5 which includes the electrostatic discharge circuits 50, through which the antistatic capability of the display panel at the notch 10 may be improved. Accordingly, the risk of electrostatic damage of the components at the notch 10 may be reduced, the product yield may be improved, and the display performance may be enhanced.

The display panel often displays images based on a plurality of pixels P. In the disclosed embodiments, when the first shift register 31 and the second shift register 32 simultaneously provide a scanning signal to a scanning line G, the pixels electrically connected to the scanning line G may be selected to receive data signals from the data line S, such that the selected pixels may emit light. The duration of light emission may be controlled by a corresponding light-emitting controlling line E electrically connected to the light-emitting controller 40.

In the disclosed embodiments, the display panel may include a plurality of notches 10. FIG. 1 shows the display panel includes one notch 10, which is for illustrative purposes and is not intended to limit the scope of the present disclosure. For the display panel which includes more than one notches 10, the same structure may be provided to achieve the same or similar technical effects of the embodiment of the present disclosure, and the details are not described herein. In addition, FIG. 1 is only a schematic illustration of the shape of the notch 10. In the practical manufacturing process, the shape of the notch 10 may be different due to process or other factors, but the functions achieved may be the same as or similar to that provided in the disclosed embodiments, which fall within the scope of the present disclosure.

Further, in one embodiment, the first sub-non-display area NA11 may be provided with the plurality of cascaded first shift registers 31; in another embodiment, the first sub-non-display area NA11 may be not provided with the plurality of cascaded first shift registers 31. That is, the scanning lines G which are not disposed adjacent to the notch 10 in the row direction may be dual-side driven by the first shift registers 31 and the second shift registers 32 to receive the scanning signal, while the scanning lines G which are disposed adjacent to the notch 10 in the row direction may be dual-side driven by the first shift registers 31 and the second shift registers 32 to receive the scanning signal (not drawn in FIG. 1) or one-side driven by the second shift registers 32 (as shown in FIG. 1), which is not limited by the present disclosure.

When the scanning lines G which are disposed adjacent to the notch 10 in the row direction are one-side driven to receive the scanning signal, in the column direction Y, intermediate signal line of the first shift registers 31 on the opposite sides of the first sub-non-display area NA11 may be desired to be continuous, i.e., non-disconnected, and may be desired to be connected after bypassing the first sub-display area NA11. Thus, the display performance may be ensured, and the frame at the notch 10 may be reduced. In one embodiment, the intermediate signal lines of the first shift register 31 may include a clock signal line, which is not limited by the present disclosure.

Figure 2:
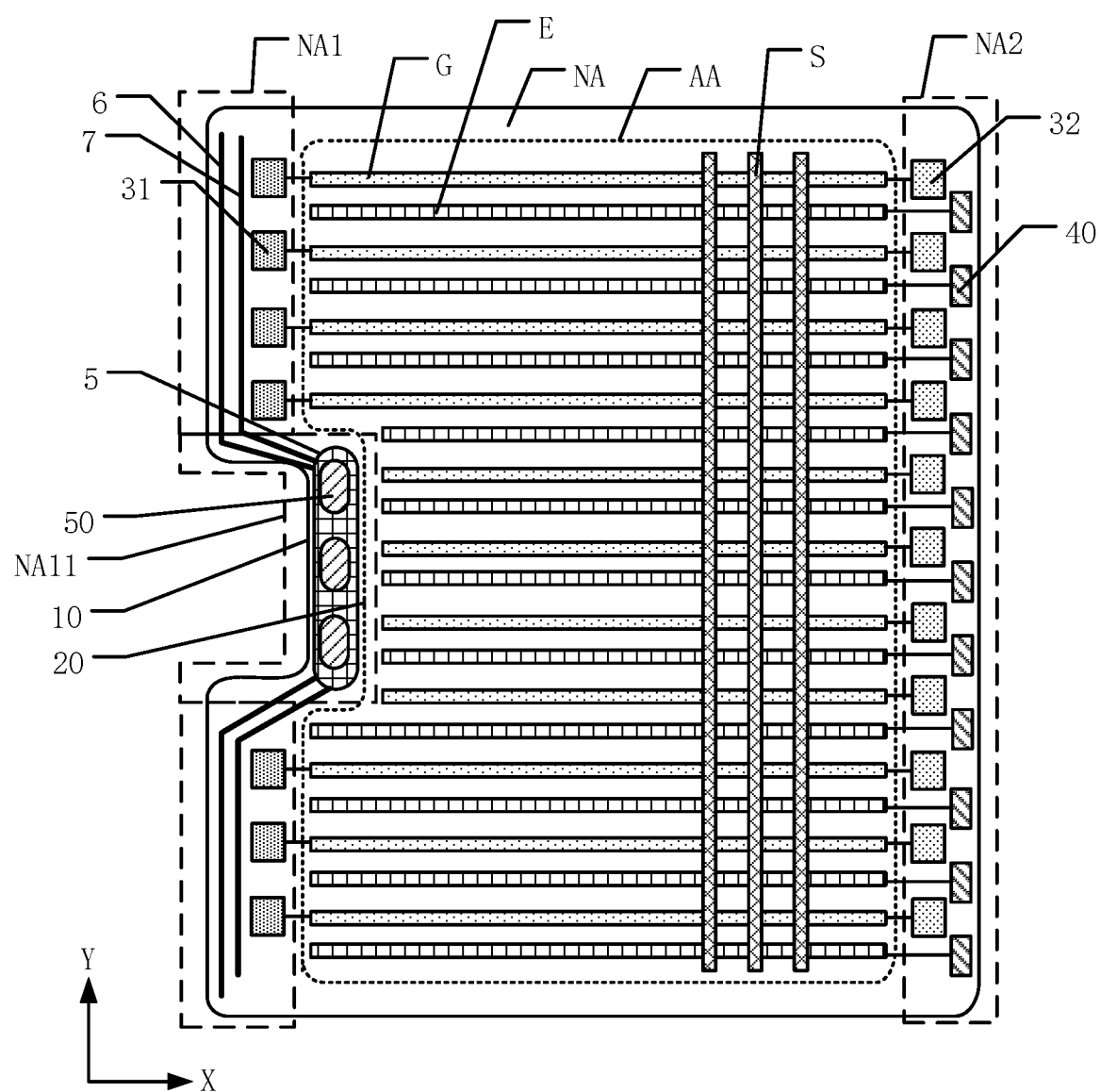
FIG. 2 illustrates a schematic top view of another exemplary display panel consistent with the disclosed embodiments.
Figure 3:
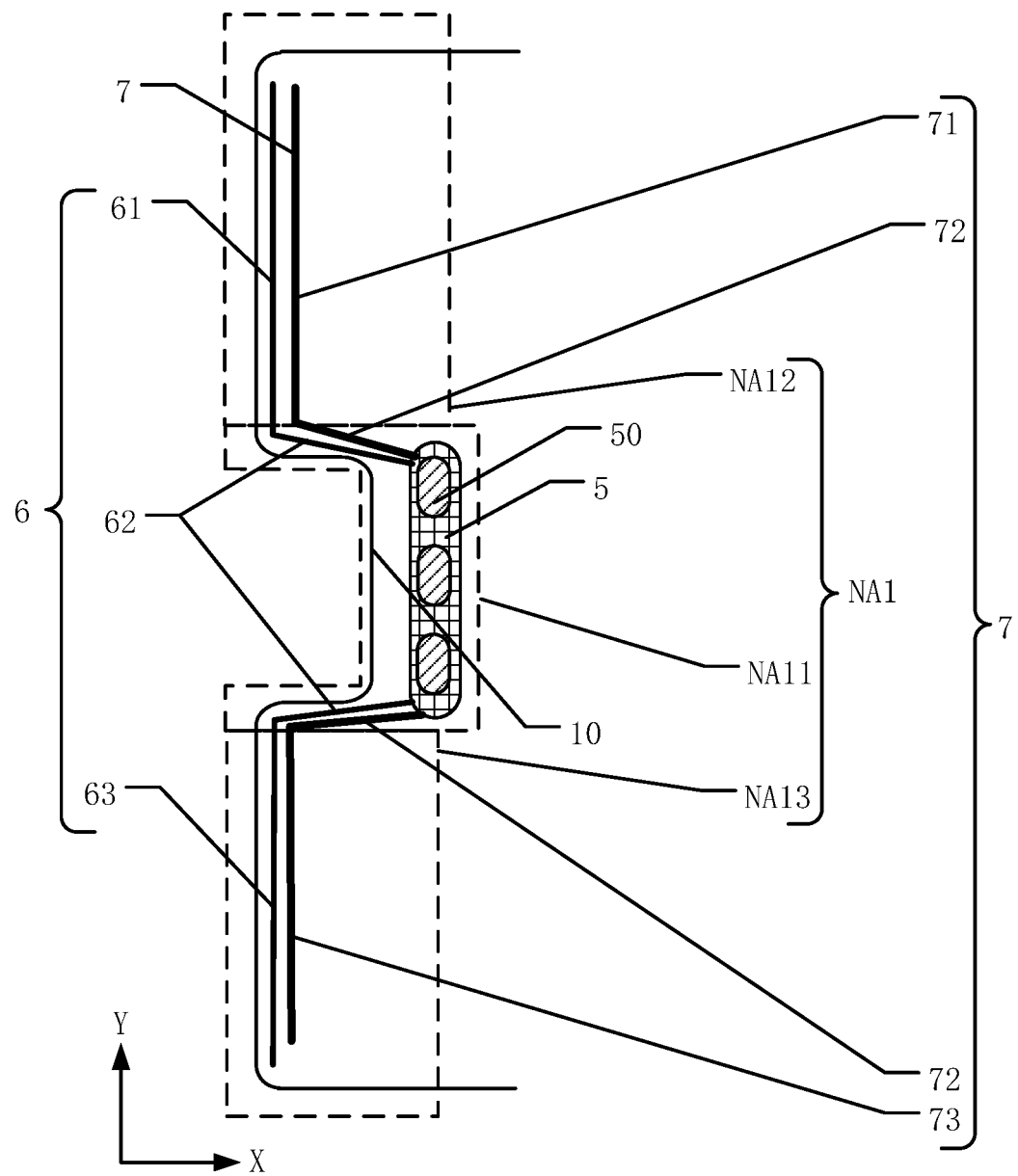
FIG. 3 illustrates an exemplary partially enlarged view of FIG. 2.

FIG. 2 illustrates a schematic top view of another exemplary display panel consistent with the disclosed embodiments, and FIG. 3 illustrates an exemplary partially enlarged view of FIG. 2. The similarities between FIG. 1 and FIG. 2 are not repeated, while certain differences may be explained.

As shown in FIG. 2 and FIG. 3, the non-display area NA may be provided with a first voltage signal line 6 and a second voltage signal line 7, both of which may be electrically connected to the electrostatic discharge circuit 50. The first voltage signal line 6 and the second voltage signal line 7 may be disposed in the non-display area NA to respectively provide a first voltage signal and a second voltage signal to the electrostatic discharge circuit 50, which is disposed in the first sub-non-display area NA11 arranged adjacent to the notch 10 in the row direction X. The first voltage signal and the second voltage signal may be two signals having different voltage levels, such that the normal operation of the electrostatic discharge circuit 50 may be enabled to enable an antistatic capability and, accordingly, the display quality and product yield of the display panel may be improved.

Further, the first voltage signal line 6 and the second voltage signal line 7 may be electrically connected to the first shift register 31, the second shift register 32, and the light-emitting controller 40 at the same time to provide desired voltage signals. That is, the first voltage signal line 6 and the second voltage signal line 7 electrically connected to the electrostatic discharge circuit 50 may be multiplexed, such that the antistatic function of the electrostatic discharge circuit 50 may be realized, the normal supply of the scanning signal and the light-emitting signal may be ensured and, meanwhile, the wires/lines to be disposed in the non-display area NA may be reduced. Accordingly, the frame size of the display panel may be reduced, which may facilitate the narrow frame of the display panel.

It should be noted that, the first voltage signal provided by the first voltage signal line 6 may be one of a high-level signal and a low-level signal, and the second voltage signal line 7 provided by the second voltage signal line 7 one of a high-level signal and a low-level signal, which is not limited by the present disclosure.

In one embodiment, as shown in FIG. 2 and FIG. 3, the first non-display area NA1 may further include a second sub-non-display area NA12 and a third sub-non-display area NA13. Along the column direction Y, the second sub-non-display area NA12 and the third sub-non-display area NA13 may be disposed at opposite sides of the first sub-non-display area NA11. The first voltage signal line 6 may be partially disposed in the first sub-non-display area NA11, partially disposed in the second sub-non-display area NA12, and partially disposed in the third sub-display area NA13. The second voltage signal line 7 may be partially disposed in the first sub-non-display area NA11, partially disposed in the second sub-non-display area NA12, and partially disposed in the third sub-display area NA13.

FIGS. 2-3 further illustrates an arrangement of the first voltage signal line 6 and the second voltage signal line 7 in the first non-display area NA1. That is, the first voltage signal line 6 and the second voltage signal line 7 each may be partially disposed in the first a sub-display area NA11, partially disposed in the second sub-display area NA12, and partially disposed in the third sub-display area NA13. In other words, the first voltage signal line 6 and the second voltage signal line 7 may be wound to be the first sub-display area NA11 to electrically connected to the plurality of electrostatic discharge circuits 50, in which the first sub-display area NA11 is disposed adjacent to the notch 10 in the row direction X. Thus, the electrostatic discharge module 5 may be enabled, and the antistatic capability of the display panel at the notch 10 may be improved.

It should be noted that, FIGS. 2-3 show an exemplary wiring structure of the first voltage signal line 6 and the second voltage signal line 7 in the first non-display area NA1, which is for illustrative purposes and is not intended to limit the scope of the present discourse. In the practical manufacturing process, due to the limitations of process or other factors, the wiring structures of the first voltage signal line 6 and the second voltage signal line 7 in the non-display area NA may be different, but the functions implemented by the first voltage signal line 6 and the second voltage signal line 7 may be the same as or similar to those provided by the disclosed embodiments, i.e., multiplexed and electrically connected to the electrostatic discharge circuit 50, which fall within the scope of the present disclosure.

In one embodiment, as shown in FIG. 2 and FIG. 3, the first voltage signal line 6 may include a first portion 61, a first winding portion 62, and a first extending portion 63. The first winding portion 62 may have two ends respectively connected to the first portion 61 and the first extending portion 63. The first portion 61 may be disposed in the second sub-non-display area NA12, the first winding portion 62 may be disposed in the first sub-non-display area NA11, and the first extending portion 63 may be disposed in the third sub-non-display area NA13. The first winding portion 62 may be electrically connected to the electrostatic discharge circuits 50.

The second voltage signal line 7 may include a second portion 71, a second winding portion 72, and a second extending portion 73. The second winding portion 72 may have two ends respectively connected to the second portion 71 and the second extending portion 73. The second portion 71 may be disposed in the second sub-non-display area NA12, the second winding portion 72 may be disposed in the first sub-non-display area NA11, and the second extending portion 73 may be disposed in the third sub-non-display area NA13. The second winding portion 2 may be electrically connected to the electrostatic discharge circuits 50.

As shown in FIG. 3, through the first winding portion 62 disposed in the first sub-non-display area NA11, after being multiplexed by the electrostatic discharge circuit 50 at the notch 10, the first voltage signal line 6 may be still able to continuously maintain a connection of the first portion 61 and the first extending portion 63. Through the second winding portion 72 disposed in the second sub-non-display area NA11, after being multiplexed by the electrostatic discharge circuit 50 at the notch 10, the second voltage signal line 7 may be still able to continuously maintain a connection of the second portion 71 and the second extending portion 73. Thus, the antistatic capability of the display panel at the notch 10 may be improved, the wires to be disposed in the non-display area NA may be further reduced. Accordingly, the frame size of the display panel may be reduced, which may facilitate the narrow frame of the display panel.

Figure 4:
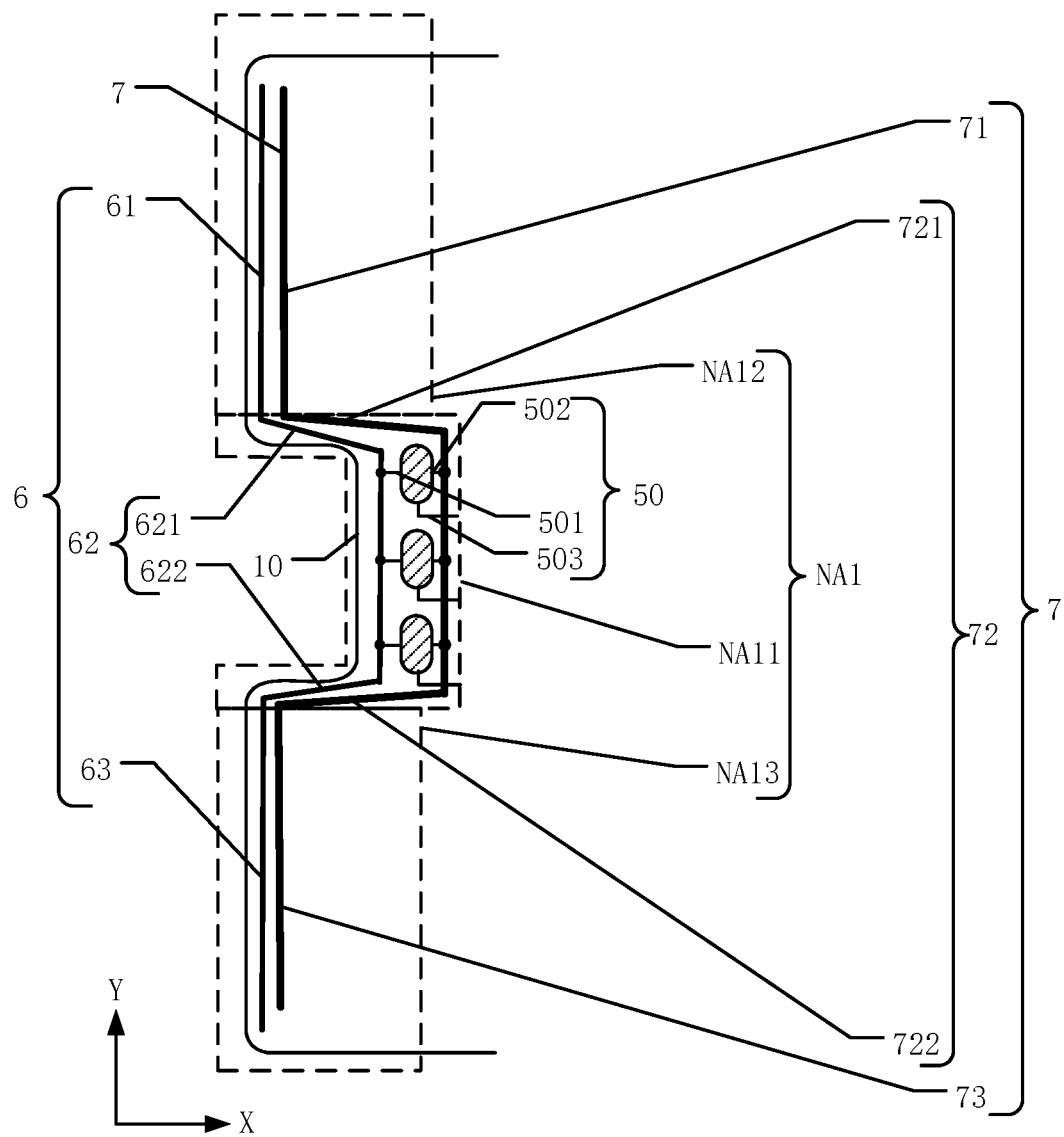
FIG. 4 illustrates another exemplary partially enlarged view of FIG. 2.

FIG. 4 illustrates another exemplary partially enlarged view of FIG. 2. The similarities between FIG. 3 and FIG. 4 are not repeated, while certain differences may be explained. As shown in FIG. 2 and FIG. 4, the electrostatic discharge circuit 50 may include a first voltage signal terminal 501, a second voltage signal terminal 502 and a protection point connecting terminal 503.

FIG. 4 further illustrates an exemplary electrical connection of the first voltage signal terminal 501, the second voltage signal terminal 502, the protection point connecting terminal 503, the first voltage signal line 6 and the second voltage signal line 7. The first winding portion 62 may include a first sub-portion 621 and a second sub-portion 622. One end of the first sub-portion 621 may be electrically connected to the first portion 61, and another end of the first sub-portion 621 may be electrically connected to the first voltage signal terminal 501. One end of the second sub-portion 622 may be electrically connected to the first voltage signal terminal 501, and another end of the second sub-portion 622 may be electrically connected to the first extending portion 63. The second winding portion 72 may include a third sub-portion 721 and a fourth sub-portion 722. One end of the third sub-portion 721 may be electrically connected to the second portion 71, and another end of the third sub-portion 721 may be electrically connected to the second voltage signal terminal 502. One end of the fourth sub-portion 722 may be electrically connected to the second voltage signal terminal 502, and another end of the fourth sub-portion 722 may be electrically connected to the second extending portion 73.

As shown in FIG. 4, the electrostatic discharge circuit 50 may include an input end which is the protection point connecting terminal 503 and output ends which are the first voltage signal end 501 and the second voltage signal end 502. The protection point connecting terminal 503 may import the static electricity generated in the operation of the display panel. The first voltage signal terminal 501 and the second voltage signal terminal 502 may provide a voltage signal for the normal operation of the electrostatic discharge circuit 50. Meanwhile, the first voltage signal terminal 501 may guide the generated static electricity to the first voltage signal line 6 through an end of the first voltage signal terminal 501, and the second voltage signal terminal 502 may guide the generated static electricity to the second voltage signal line 7 through an end of the second voltage signal terminal 502. Further, the first voltage signal line 6 and the second voltage signal line 7 may be connected to an external power source, thereby discharging the static electricity to the external power source for reutilization.

Figure 5:
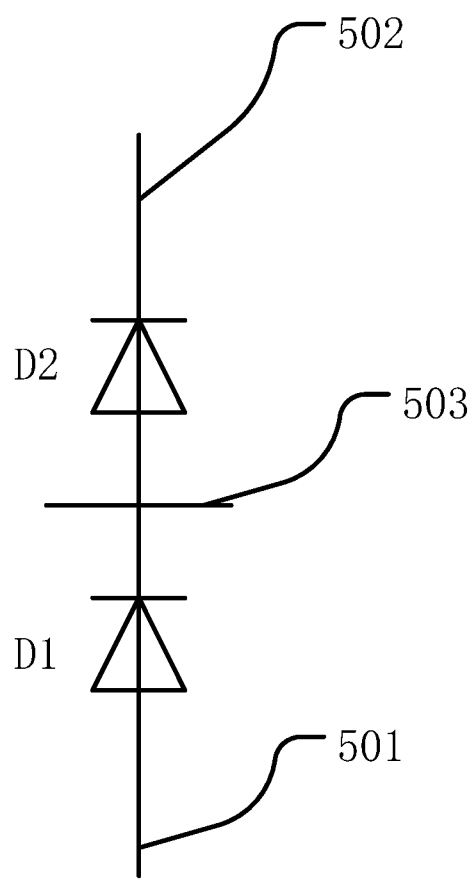
FIG. 5 illustrates a schematic diagram of an exemplary an electrostatic discharge circuit consistent with the disclosed embodiments.

FIG. 5 illustrates a schematic diagram of an exemplary an electrostatic discharge circuit consistent with the disclosed embodiments. As shown FIG. 5, the electrostatic discharge circuit 50 may further include a first diode D1 and a second diode D2 connected in series. The cathode of the first diode D1 may be electrically connected to the anode of the second diode D2 and the protection point connecting terminal 503, and the anode of the first diode D1 may be electrically connected to the first voltage signal terminal 501. The cathode of the second diode D2 may be electrically connected to the second voltage signal terminal 502.

FIG. 5 illustrates that the electrostatic discharge circuit 50 may have a circuit structure composed of two diodes. As shown in FIG. 5, when the voltage at the protection point connecting terminal 503 is lower than the voltage at the first voltage signal terminal 501, the first diode D1 may be turned on, such that the generated static electricity may be guided to the first voltage signal line 6 connected to the first voltage signal terminal 501, and then guided away or released. When the voltage at the protection point connecting terminal 503 is higher than the voltage at the second voltage signal terminal 502, the second diode D2 may be turned on, such that the generated static electricity may be guided to the second voltage signal line 7 connected to the second voltage signal terminal 502, and then guided away or released. When the voltage at the protection point connecting terminal 503 is a normal voltage (i.e., a voltage between the voltage at the first voltage signal terminal 501 and the voltage at the second voltage signal terminal 502), the first diode D1 and the second diode D2 may not be turned on, such that the normal operation of the display panel may not be affect. The first diode D1 and the second diode D2 may be only turned on in response to the generation of the static electricity.

Figure 6:
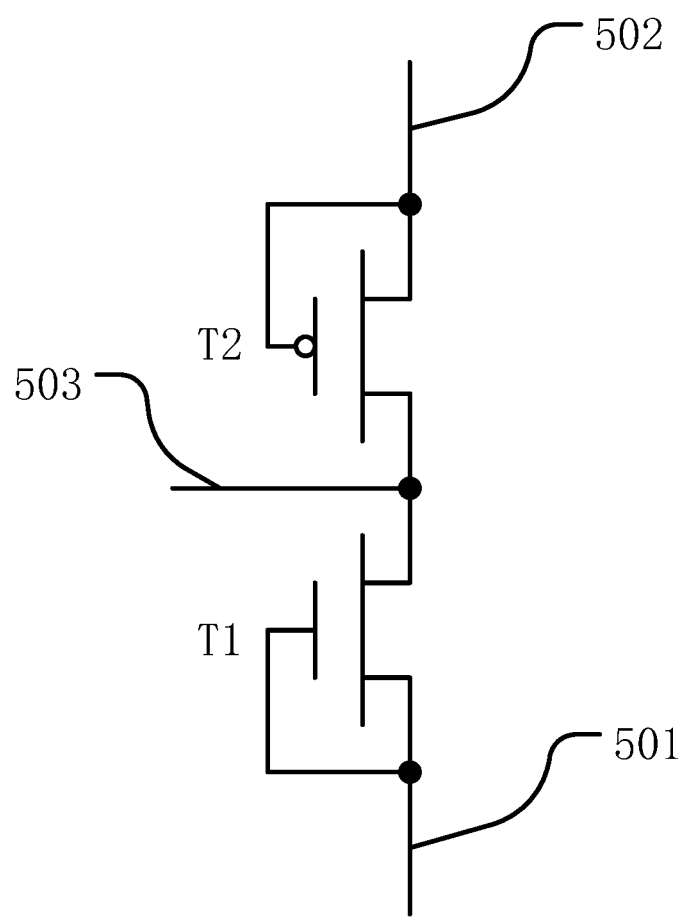
FIG. 6 illustrates a schematic diagram of another exemplary electrostatic discharge circuit consistent with the disclosed embodiments.

FIG. 6 illustrates a schematic diagram of another exemplary electrostatic discharge circuit consistent with the disclosed embodiments. As shown FIG. 6, the electrostatic discharge circuit 50 may further include a first transistor T1 and a second transistor T2 connected in series. A gate electrode of the first transistor T1 may be electrically connected to a source electrode of the first transistor T1, the source electrode of the first transistor T1 may be electrically connected to the first voltage signal terminal 501, and a drain electrode of the first transistor T1 may be electrically connected to both a source electrode of the second transistor T2 and the protection point connecting terminal 503. A gate electrode of the second transistor T2 may be electrically connected to a drain electrode of the second transistor, and the drain electrode of the second transistor T2 may be electrically connected to the second voltage signal terminal 502.

FIG. 6 illustrates that the electrostatic discharge circuit 50 may have a circuit structure composed of two transistors. As shown in FIG. 6, when the voltage at the protection point connecting terminal 503 is lower than the voltage at the first voltage signal terminal 501, the first transistor T1 may be turned on while the second transistor T2 may be turned off, such that the static electricity may be guided to the first voltage signal line 6 connected to the first voltage signal terminal 501, and then guided away or released. When the voltage at the protection point connecting terminal 503 is higher than the voltage at the second voltage signal 502, the first transistor T1 may be turned off while the second transistor T2 may be turned on, such that the static electricity may be guided to the second voltage signal line 7 connected to the second voltage signal terminal 502, and then guided away or released. When the voltage at the protection point connecting terminal 503 is a normal voltage (i.e., a voltage between the voltage at the first voltage signal terminal 501 and the voltage at the second voltage signal terminal 502), the first transistor T1 and the second transistor T2 may not be turned on, such that the normal operation of the display panel may not be affect. The first transistor T1 and the second transistor T2 may be only turned on in response to the generation of the static electricity.

It should be noted that each of the first transistor T1 and the second transistor T2 may be a low-temperature polysilicon thin film transistor (TFT), or may be a metal-oxide-semiconductor field-effect transistor (MOS), which is not limited by the present disclosure. Further, the source and drain electrodes of each of transistor may be interchangeable, and the details are not explained herein.

In one embodiment, as shown in FIG. 6, the first transistor T1 may be an N-type transistor, and the second transistor T2 may be a P-type transistor. Taking a metal-oxide-semiconductor field-effect transistor (i.e., a MOS transistor) as an example. The PMOS transistor has two P+ regions on a N-type silicon substrate, which are named as a source electrode and a drain electrode, respectively. The source electrode and the drain electrode are not electrically connected. When a sufficient high positive voltage (the source electrode is connected to the ground) is applied to the gate electrode, the N type silicon surface exhibits a P-type inversion layer and becomes a channel connecting the source electrode and the drain electrode. The P-type MOSFET has a substantially low hole mobility and, thus, the PMOS transistor has a smaller transconductance than the NMOS transistor in the case where the MOS transistors have the same geometry size and the same absolute value of the operating voltage. In addition, the absolute value of the threshold voltage of the PMOS transistor is substantially high and, thus, desires a substantially high operating voltage.

In certain embodiments, to fabricate an NMOS transistor, two highly doped N+ regions may be formed on a P-type silicon substrate with a low doping concentration. The two highly doped N+ regions may have a large number of electron sources which provide free electrons for current flow, and the P-type silicon substrate with the low doping concentration may provide a large number of movable holes. Two electrodes used as a drain electrode D and a source electrode S may be extracted by metal aluminum. Then the surface of the semiconductor may be covered with a thin layer of silicon dioxide insulating layer, and an aluminum electrode (usually polysilicon) may be disposed on the insulating layer between the drain electrode D and source electrode S as a gate electrode G, and an electrode may be extracted on the substrate.

Figure 7:
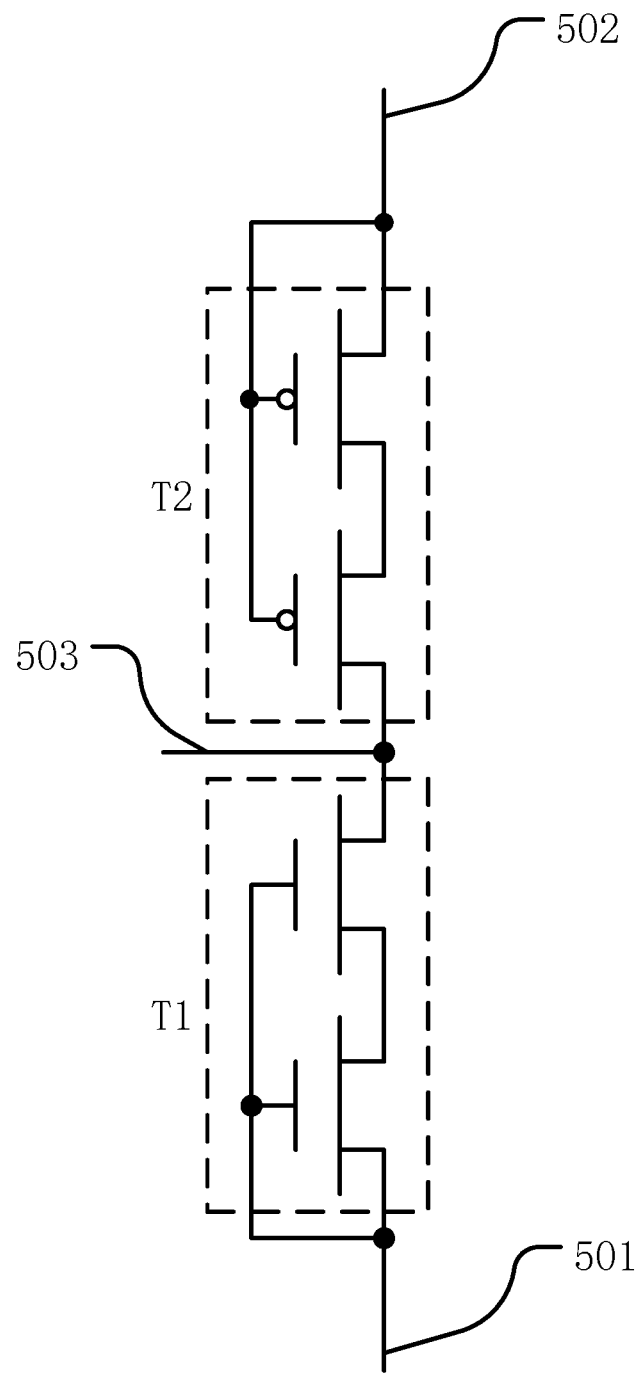
FIG. 7 illustrates a schematic diagram of another exemplary electrostatic discharge circuit consistent with the disclosed embodiments.

FIG. 7 illustrates a schematic diagram of another exemplary electrostatic discharge circuit consistent with the disclosed embodiments. The similarities between FIG. 6 and FIG. 7 are not repeated, while certain differences may be explained.

As shown FIG. 7, the first transistor T1 may be a dual-gate N-type transistor, and the second Transistor T2 may be a dual-gate P-type transistor. Taking a MOS transistor as an example, a dual-gate MOS transistor may be capable of reducing parasitic parameters to increase a cutoff frequency. The dual-gate MOS transistor may have a first gate electrode and second gate electrode. The dual-gate MOS transistor may be grounded through the second gate electrode, and may provide an effective electrostatic shielding function between the first gate electrode and the drain electrode, such that the feedback capacitance between the gate electrode and the drain electrode may be greatly reduced, and the cutoff frequency may be increased.

Figure 8:
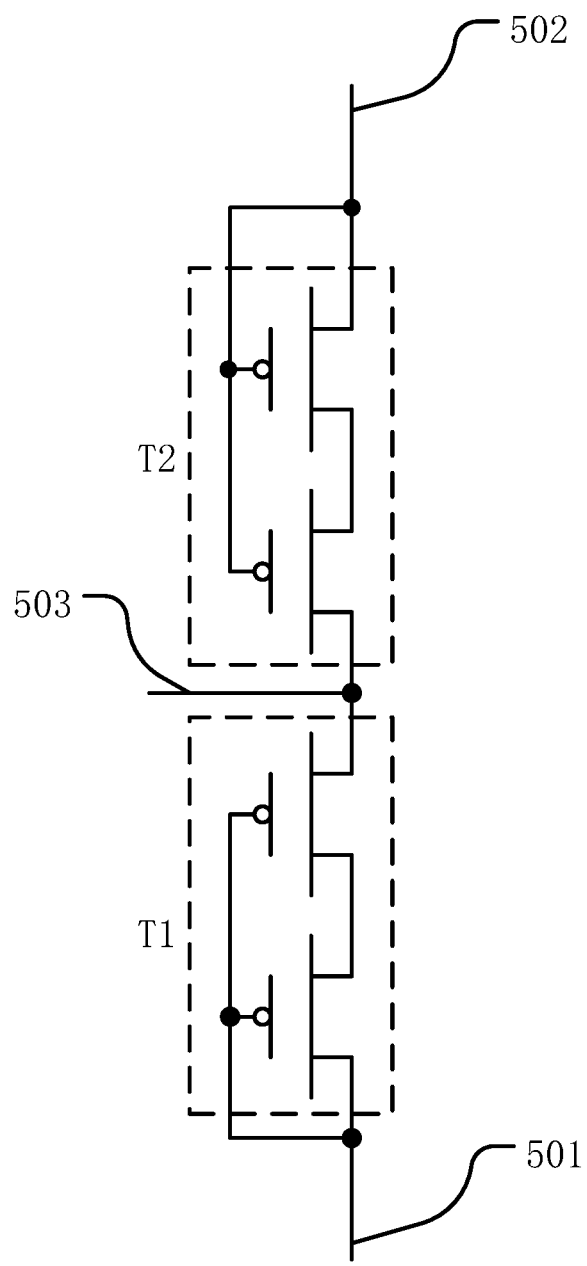
FIG. 8 illustrates a schematic diagram of another exemplary electrostatic discharge circuit consistent with the disclosed embodiments.

FIG. 8 illustrates a schematic diagram of another exemplary electrostatic discharge circuit consistent with the disclosed embodiments. The similarities between FIG. 8 and FIG. 7 are not repeated, while certain differences may be explained. As shown FIG. 8, both the first transistor T1 and the second Transistor T2 may be dual-gate P-type transistors.

Figure 9:
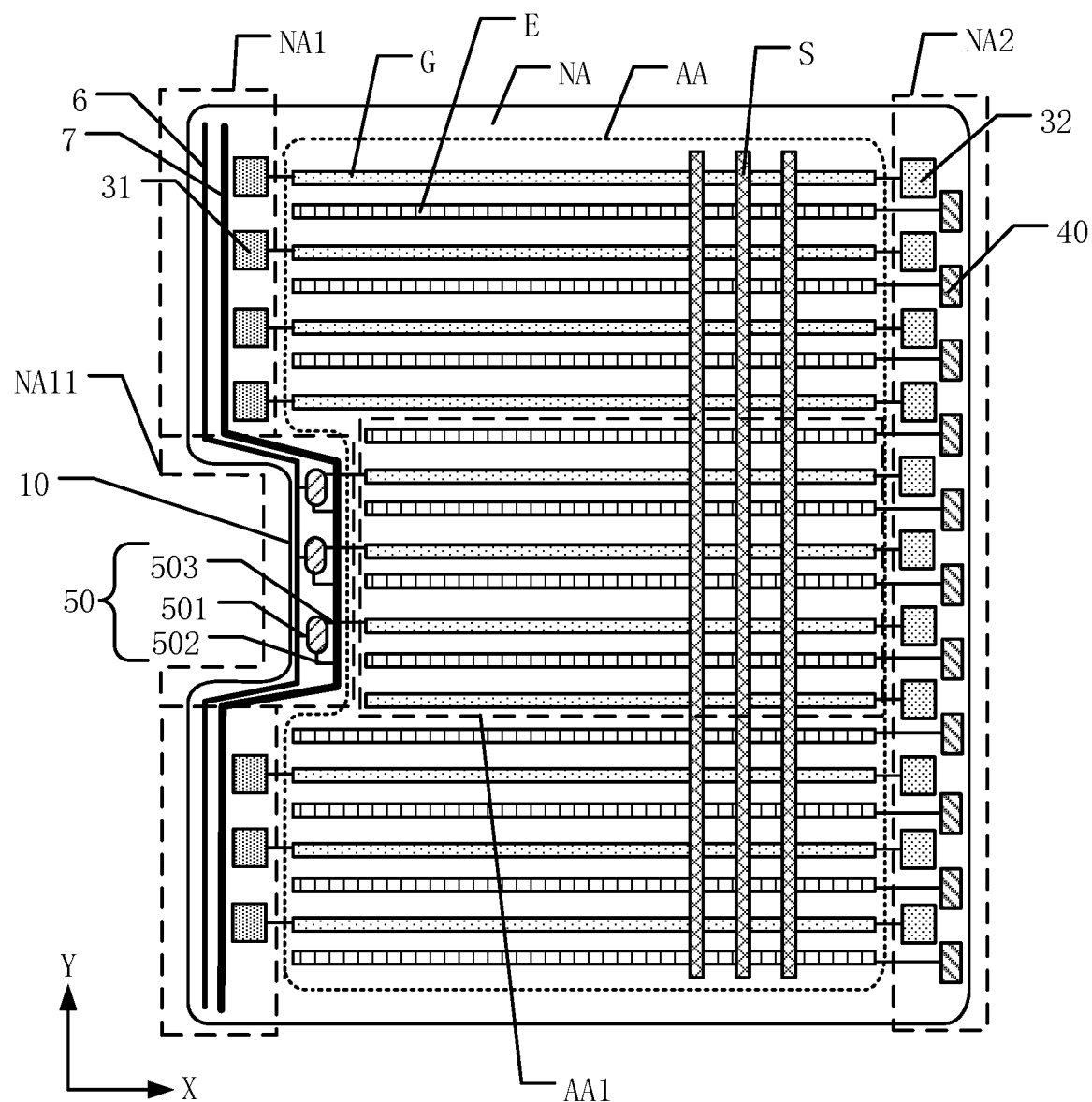
FIG. 9 illustrates a schematic top view of another exemplary display panel consistent with the disclosed embodiments.

FIG. 9 illustrates a schematic top view of another exemplary display panel consistent with the disclosed embodiments. The similarities between FIG. 9 and FIG. 2 are not repeated, while certain differences may be explained. As shown in FIG. 9, the display area AA may include a first display area AA1. Along the row direction X, the first display area AA1 and the first sub-non-display area NA11 may be disposed adjacent to each other. The scanning line G in the first display area AA1 may include a first end G1, which may be an end close to the first sub-non-display area NA11. The first end G1 of the scanning line G may be electrically connected to the protection point connecting terminal 503.

FIG. 9 further illustrates that the protection point connecting terminal 503 of the electrostatic discharge circuit 50 may be electrically connected to the scanning line G in the first display area AA1, and the first display area AA1 and the first sub-non-display area NA11 may be adjacently disposed in the row direction X. That is, the first display area AA1 may be a display area adjacent to the notch 10 in the row direction. Through electrically connecting the protection point connecting terminal 503 of the electrostatic discharge circuit 50 to the scanning line G in the first display area AA1, the static electricity generated by the scanning line G in the first display area AA1 may be released and guided away. Accordingly, the antistatic ability of the display panel at the notch 10 may be improved, and the display performance may be enhanced.

FIG. 9 shows that the first display area AA1 includes four scanning lines G and three electrostatic discharge circuits 50, three of which each is electrically connected to the protection point connecting terminal 503 of the corresponding electrostatic discharge circuit 50, which is for illustrative purposes and is not intended to limit the scope of the present disclosure. In certain embodiments, each scanning line G in the first display area AA1 may be electrically connected to the protection point connecting terminal 503 of the corresponding electrostatic discharge circuit 50.

In certain embodiments, referring to FIG. 2 to FIG. 4, the first voltage signal line 6 may be a VGL signal line (i.e., low-level voltage signal line) for accessing a low potential signal, and the second voltage signal line 7 may be a VGH signal line (i.e., high-level voltage signal line) for accessing a high potential signal. In certain other embodiments, the voltage signals accessed by the first voltage signal line 6 and the second voltage signal line 7 may be interchangeable. Those skilled in the art may modify the circuit structure accordingly to various application scenarios, the technical effect achieved may be the same as that provided by the disclosed embodiments, and the details are not described herein.

In the disclosed embodiments, the display panel may be a plasma display panel, a field emission display panel, a light-emitting diode (LED) display panel, an organic light-emitting diode (OLED) display panel, a liquid crystal display (LCD) panel, a quantum dots (QDs) display panel, an electrophoretic display panel, etc. Further, the display panel may include any appropriate type of display panels which are not limited by the present disclosure.

In one embodiment, referring to FIGS. 1-4, the display panel may be an LCD panel, i.e., the technical solution provided by the present disclosure may be implemented into the LCD panels. Liquid crystal displays (LCDs) are a type of flat panel displays used for screens of televisions and computers. LCDs have the advantages of low power consumption, small size and low radiation. An LCD panel includes a certain number of color or black and white pixels which are placed in front of a light source or a reflective surface, and LC molecules inside the LCD panel are stimulated by current to generate dots, lines and faces, which operate with a backlight lamp to display images.

Liquid crystals (LCs) are a state of matter which has properties between those of conventional liquids and those of solid crystals. For instance, a liquid crystal may flow like a liquid, but its molecules may be oriented in a crystal-like way. Further, the molecular arrangement of the LCs will be changed through applying an electric field to the LCs. Through working with polarizers, the LCs are able to transmit light without any applied electric field (or more generally below some minimal value which is too small to reorient LC molecules) and block light with an applied electric field (or more generally above some minimal value which is large enough to reorient LC molecules). Through further working with color filters, the amount of light transmission of a certain color would be changed by changing the voltage applied to the LC molecules. That is, through changing the voltage across the LC molecules, the corresponding light transmittance would be changed. The LCD panels have a low power consumption and, thus, are applicable to battery-operated electronic devices.

In one embodiment, referring to FIGS. 1-4, the display panel may be an organic light-emitting display panel, i.e., the technical solution provided by the present disclosure may be implemented into the organic light-emitting display panel. The organic light-emitting display panels, i.e., the organic light-emitting diodes (OLEDs) have many advantages that LCD panels are incomparable because of its characteristics such as lightness and power saving. The display technology of the organic light-emitting display panels is different from that of the conventional LCD panels. Instead of using a backlight lamp, the organic light-emitting display panel includes very thin organic material coatings and glass substrates, and when an electric current passes, the organic materials emit light. Moreover, compared with LCD panels, the OLED display panels are featured with lighter and thinner structure, more effective power saving and larger viewing angle.

Figure 10:
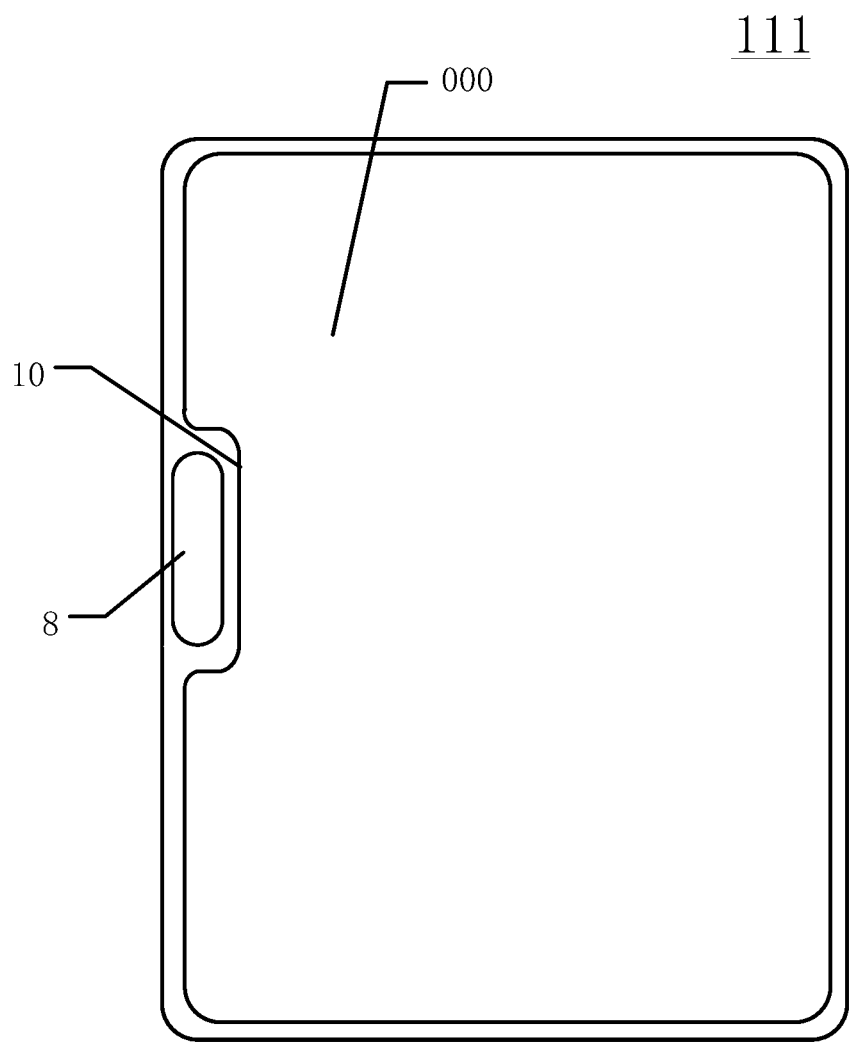
FIG. 10 illustrates a schematic top view of an exemplary display device consistent with the disclosed embodiments.

The present disclosure also provides a display device comprising the disclosed display panel. FIG. 10 illustrates a schematic view of an exemplary display device 111 consistent with the disclosed embodiments. As shown in FIG. 10, the display device 111 may include a display panel 000, which is any one of the disclosed display panels. FIG. 23 illustrates the display device 111 may be a mobile phone. The display device 111 may also be a display device having a display function, such as a computer, a television, a vehicle display, etc., which is not limited by the present disclosure. Because the disclosed display device includes any one of the disclosed display panels, the disclosed display device may also have the same features as the disclosed display panel, and details are not described herein again.

In one embodiment, as shown in FIG. 10, the display device 111 may further include an imaging component 8 (e.g., a camera) disposed in the notch 10. Through configuring the imaging element 8 to be disposed in the notch 10, the shape of the display panel 000 may be designed to bypass the imaging component 8, thereby increasing the screen-to-body ratio of the display device, enhancing the display performance, and meeting the design requirements of the full screen.

It should be noted that, FIG. 10 shows the imaging component 8 may be disposed in the notch 10, which is for illustrative purposes and is not intended to limit the scope of the present disclosure. In practical applications, various functional modules, such as a sensor or a speaker, may be disposed in the notch 10 according to various application scenarios, and the details are not described herein.

Figure 11:
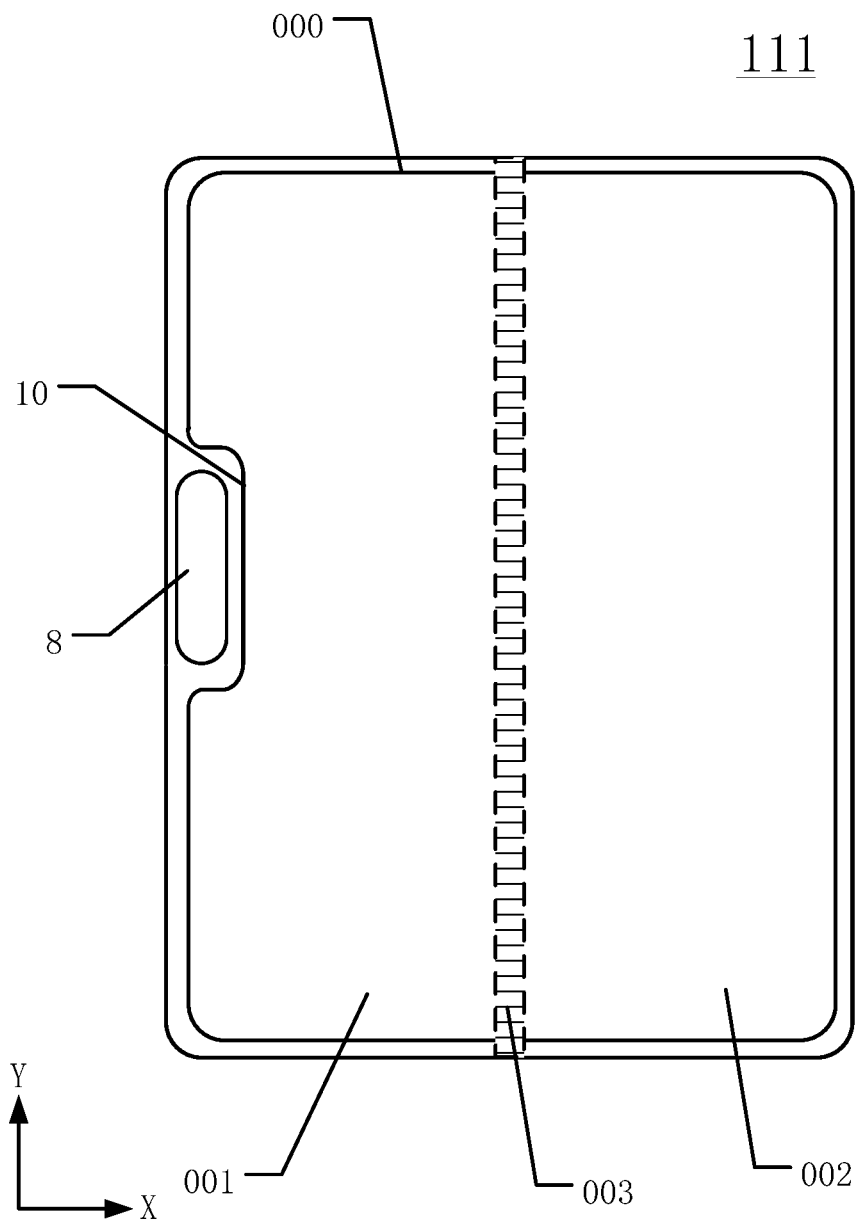
FIG. 11 illustrates a schematic top view of another exemplary display device consistent with the disclosed embodiments.
Figure 12:
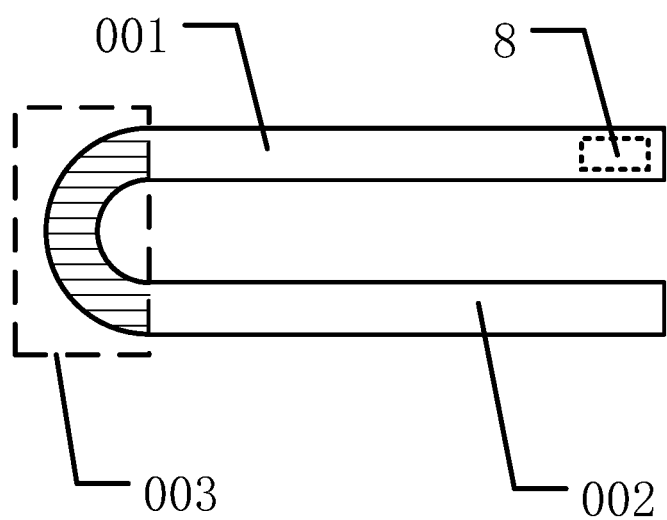
FIG. 12 illustrates a schematic view of a bent state of another exemplary display device in FIG. 11 consistent with the disclosed embodiments.

FIG. 11 illustrates a schematic top view of another exemplary display device 111 consistent with the disclosed embodiments; and FIG. 12 illustrates a schematic view of a bent state of another exemplary display device in FIG. 11 consistent with the disclosed embodiments.

As shown in FIGS. 11-12, the display device 111 may be a flexible display device, which may include a bent region 003 extending in the column direction Y. The bent region 003 may divide the flexible display device into a first region 001 having the notch 10 and a second region 002 without the notch 10. The display device 111 may include a first state and a second state. In the first state, the display device 111 may be unfolded along the bent region 003, such that the first region 001 and the second region 002 disposed at opposite sides of the bent region 003 may be in the same plane (as shown in FIG. 11). Accordingly, the user may simultaneously watch the first region 001 and the second region 002, enabling a large screen display experience.

In the second state, the display device 111 may be folded along the bent region 003, such that the first region 001 and the second region 002 disposed at opposite sides of the bent region 003 may at least partially overlap with each other (as shown in FIG. 12). The folded display device 111 may be more portable and convenient for the carry and storage. That is, the user may select the usage state of the display device according to different usage scenarios, thereby improving the user experience.

In the disclosed embodiments, the irregular-shaped edge may be recessed toward the inside of the display area to form a space in which components such as a camera would be mounted, i.e., the notch. Thus, the designed shape of the display panel may able to bypass some functional modules of the display device, such as a camera module, a sensor module or a speaker module, thereby improving the screen-to-body ratio of the display panel, enhancing the display effect and stratifying the user requirements of the visual effect, accordingly. In addition, the first shift register in the first non-display area and the second shift register in the second non-display area may simultaneously provide a scanning signal to a scanning line, which reduces scanning charging time, improves scanning efficiency, and improves user experience.

The second non-display area may include the plurality of cascaded light-emitting controllers, i.e., the plurality of cascaded light-emitting controllers may be disposed in the second non-display area which is arranged opposite to the notch. Meanwhile, the light-emitting controllers may be electrically connected to the light-emitting controlling lines. On one hand, the light-emitting controlling signal may be provided to the light-emitting controlling line E through the light-emitting controller, on the other hand, the plurality of cascaded light-emitting controllers may not occupy any space of the non-display area NA arranged close to the notch. Thus, the wires arrangement at the notch may not be affected by the light-emitting controller 40, which may facilitate the narrow frame design of the display panel and improve the screen-to-body ratio.

Further, the first sub-non-display area may be provided with the electrostatic discharge module which includes the plurality of electrostatic discharge circuits, which may improve the antistatic capability of the display panel at the notch 10. Accordingly, the risk of static damage of the components at the notch may be reduced, the product yield may be improved, and the display performance may be enhanced.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
  a display area including a plurality of data lines, a plurality of scanning lines, a plurality of light-emitting controlling lines, and an irregular-shaped edge, wherein the scanning lines and the light-emitting controlling lines extend in a row direction, the data lines and the irregular-shaped edge extend in a column direction, and the row direction is perpendicular to the column direction;
  a non-display area including a first non-display area and a second non-display area, wherein along the row direction, the first non-display area and the second non-display area sandwiches the display area; and
  at least one notch;
  wherein the irregular-shaped edge is recessed along a row direction towards an inside of the display area to form the at least one notch,
  the first non-display area includes a plurality of cascaded first shift registers, and a first shift register is electrically connected to one end of a scanning line,
  the second non-display area includes a plurality of cascaded second shift registers and a plurality of cascaded light-emitting controllers, a second shift register is electrically connected to another end of the scanning line, and a light-emitting controller is electrically connected to a light-emitting controlling line, and
  the first non-display area includes a first sub-non-display area disposed adjacent to the at least one notch in the row direction, and an electrostatic discharge module including a plurality of electrostatic discharge circuits is disposed in the first sub-non-display area, and
  the at least one notch, the plurality of cascaded first shift registers, and the plurality of electrostatic discharge circuits are arranged at a same end of the plurality of scanning lines.

2. The display panel according to claim 1, wherein:
  a first voltage signal line and a second voltage signal line are disposed in the non-display area, and
  the first voltage signal line and the second voltage signal line are electrically connected to the electrostatic discharge circuit.

3. The display panel according to claim 2, wherein:
  the first voltage signal line is low-level voltage (VGL) signal line, and the second voltage signal line is a high-level voltage (VGH) signal line.

4. The display panel according to claim 1, wherein:
  the display panel is a liquid crystal display panel.

5. The display panel according to claim 1, wherein:
  the display panel is an organic light-emitting display panel.

6. A display panel, comprising:
  a display area including a plurality of data lines, a plurality of scanning lines, a plurality of light-emitting controlling lines, and an irregular-shaped edge, wherein the scanning lines and the light-emitting controlling lines extend in a row direction, the data lines and the irregular-shaped edge extend in a column direction, and the row direction is perpendicular to the column direction;
  a non-display area including a first non-display area and a second non-display area, wherein along the row direction, the first non-display area and the second non-display area are disposed at opposite sides of the display area; and
  at least one notch, wherein:
  the irregular-shaped edge is recessed towards an inside of the display area to form the at least one notch,
  the first non-display area includes a plurality of cascaded first shift registers, and a first shift register is electrically connected to one end of a scanning line,
  the second non-display area includes a plurality of cascaded second shift registers and a plurality of cascaded light-emitting controllers, a second shift register is electrically connected to another end of the scanning line, and a light-emitting controller is electrically connected to a light-emitting controlling line, the first non-display area includes a first sub-non-display area disposed adjacent to the at least one notch in the row direction, and an electrostatic discharge module including a plurality of electrostatic discharge circuits is disposed in the first sub-non-display area, the first non-display area further includes a second sub-non-display area and a third sub-non-display area, wherein along the column direction, the second sub-non-display area and the third sub-non-display area are disposed at opposite sides of the first sub-non-display area;

a first voltage signal line is partially disposed in the first sub-non-display area, partially disposed in the second sub-non-display area, and partially disposed in the third sub-display area; and a second voltage signal line is partially disposed in the first sub-non-display area, partially disposed in the second sub-non-display area, and partially disposed in the third sub-display area.

7. The display panel according to claim 6, wherein:
the first voltage signal line includes a first portion disposed in the second sub-non-display area, a first winding portion disposed in the first sub-non-display area, and a first extending portion disposed in the third sub-non-display area, wherein the first winding portion has two ends respectively connected to the first portion and the first extending portion, and the first winding portion is electrically connected to the electrostatic discharge circuit; and the second voltage signal line includes a second portion disposed in the second sub-non-display area, a second winding portion disposed in the first sub-non-display area, and a second extending portion disposed in the third sub-non-display area, wherein the second winding portion has two ends respectively connected to the second portion and the second extending portion, and the second winding portion is electrically connected to the electrostatic discharge circuit.

8. The display panel according to claim 7, wherein:
the electrostatic discharge circuit includes a first voltage signal terminal, a second voltage signal terminal and a protection point connecting terminal;
the first winding portion includes a first sub-portion and a second sub-portion, wherein the first sub-portion has two ends respectively electrically connected to the first portion and the first voltage signal terminal, and the second sub-portion has two ends respectively electrically connected to the first voltage signal terminal and the first extending portion; and
the second winding portion includes a third sub-portion and a fourth sub-portion, wherein the third sub-portion has two ends respectively electrically connected to the second portion and the second voltage signal terminal, and the fourth sub-portion has two ends respectively electrically connected to the second voltage signal terminal and the second extending portion.

9. The display panel according to claim 8, wherein:
the electrostatic discharge circuit further includes a first diode and a second diode connected in series,
wherein a cathode of the first diode is electrically connected to an anode of the second diode and the protection point connecting terminal, and an anode of the first diode is electrically connected to the first voltage signal terminal, and a cathode of the second diode is electrically connected to the second voltage signal terminal.

10. The display panel according to claim 8, wherein:
the electrostatic discharge circuit further includes a first transistor and a second transistor connected in series,
wherein a gate electrode of the first transistor is electrically connected to a source electrode of the first transistor, the source electrode of the first transistor is electrically connected to the first voltage signal terminal, and a drain electrode of the first transistor is electrically connected to both a source electrode of the second transistor and the protection point connecting terminal, and
a gate electrode of the second transistor is electrically connected to a drain electrode of the second transistor, and the drain electrode of the second transistor is electrically connected to the second voltage signal terminal.

11. The display panel according to claim 10, wherein:
the first transistor is an N-type transistor, and the second transistor is a P-type transistor.

12. The display panel according to claim 10, wherein:
the first transistor is a dual-gate N-type transistor, and the second transistor is a dual-gate P-type transistor.

13. The display panel according to claim 10, wherein:
the first transistor and the second transistor each is a dual-gate P-type transistor.

14. The display panel according to claim 8, wherein:
the display area includes a first display area,
wherein along the row direction, the first display area and the first sub-non-display area are disposed adjacent to each other, and
the scanning line in the first display area includes a first end which is an end close to the first sub-non-display area, and the first end of the scanning line is electrically connected to the protection point connecting terminal.

15. A display device, comprising:
a display panel, where the display panel comprises:
  a display area including a plurality of data lines, a plurality of scanning lines, a plurality of light-emitting controlling lines, and an irregular-shaped edge, wherein the scanning lines and the light-emitting controlling lines extend in a row direction, the data lines and the irregular-shaped edge extend in a column direction, and the row direction is perpendicular to the column direction;
  a non-display area including a first non-display area and a second non-display area, wherein along the row direction, the first non-display area and the second non-display area sandwiches the display area; and
  at least one notch;
  wherein the irregular-shaped edge is recessed along a row direction towards an inside of the display area to form the at least one notch,
  the first non-display area includes a plurality of cascaded first shift registers, and a first shift register is electrically connected to one end of a scanning line,
  the second non-display area includes a plurality of cascaded second shift registers and a plurality of cascaded light-emitting controllers, a second shift register is electrically connected to another end of the scanning line, and a light-emitting controller is electrically connected to a light-emitting controlling line, and the first non-display area includes a first sub-non-display area disposed adjacent to the at least one notch in the row direction, and an electrostatic discharge module including a plurality of electrostatic discharge circuits is disposed in the first sub-non-display area, and the at least one notch, the plurality of cascaded first shift registers, and the plurality of electrostatic discharge circuits are arranged at a same end of the plurality of scanning lines.

16. The display device according to claim 15, wherein:

a first voltage signal line and a second voltage signal line are disposed in the non-display area, and the first voltage signal line and the second voltage signal line are electrically connected to an electrostatic discharge circuit.

17. The display device according to claim 16, wherein:

the first non-display area further includes a second sub-non-display area and a third sub-non-display area, wherein along the column direction, the second sub-non-display area and the third sub-non-display area are disposed at opposite sides of the first sub-non-display area;

a first voltage signal line is partially disposed in the first sub-non-display area, partially disposed in the second sub-non-display area, and partially disposed in the third sub-display area; and a second voltage signal line is partially disposed in the first sub-non-display area, partially disposed in the second sub-non-display area, and partially disposed in the third sub-display area.

* * * * *